United States Patent
Kim et al.

(10) Patent No.: US 6,891,651 B2
(45) Date of Patent: May 10, 2005

(54) EML TRANSMITTER APPLYING BAND STOP FILTER

(75) Inventors: Sung-Kee Kim, Seoul (KR); Gyu-Woong Lee, Suwon-shi (KR); Yun-Je Oh, Yongin-shi (KR); Seong-Taek Hwang, Pyongtaek-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/619,318

(22) Filed: Jul. 14, 2003

(65) Prior Publication Data

US 2004/0131367 A1 Jul. 8, 2004

(30) Foreign Application Priority Data

Jan. 2, 2003 (KR) ................................ 10-2003-0000141

(51) Int. Cl.[7] ................................................. G02F 1/01
(52) U.S. Cl. ........................ 359/240; 359/154; 359/180
(58) Field of Search ................................ 359/154, 180, 359/238, 240–1, 245, 252, 262, 275, 246, 315; 365/123, 10

(56) References Cited

U.S. PATENT DOCUMENTS

| | | | | |
|---|---|---|---|---|
| 5,570,440 A | * | 10/1996 | Mizrahi | ........................ 385/37 |
| 6,212,540 B1 | * | 4/2001 | Murakami et al. | .......... 708/819 |
| 6,222,861 B1 | * | 4/2001 | Kuo et al. | ..................... 372/20 |
| 6,563,622 B2 | * | 5/2003 | Mueller et al. | ............. 398/182 |
| 6,580,859 B1 | * | 6/2003 | Maier | .......................... 385/122 |
| 2003/0219195 A1 | * | 11/2003 | Ionov | .......................... 385/15 |

\* cited by examiner

Primary Examiner—Jordan M. Schwartz
Assistant Examiner—Jessica Stultz
(74) Attorney, Agent, or Firm—Cha & Reiter, L.L.C.

(57) ABSTRACT

An EML transmitter having a band stop filter to improve the transmission characteristics before and after the transmission is provided. This is achieved by improving the chirp characteristics and the extinction ratio during the transmission of optical signals using an EML. The inventive EML transmitter includes: an EML for generating transmission light; a first lens for focusing optical signal outputs from the EML to prevent loss of the optical signals; a second lens for focusing the optical signals into a core portion of an optical line; and, a band stop filter for removing the D.C. component from the optical signals outputted by the EML.

17 Claims, 9 Drawing Sheets

EML TRANSMITTER APPLYING BAND STOP FILTER

CLAIM OF PRIORITY

This application claims priority to an application entitled "EML transmitter applying band stop filter," filed with the Korean Intellectual Property Office on Jan. 2, 2003 and assigned Serial No. 2003-141, the contents of which are hereby incorporated by reference.

BACKGROUND OF THE INVENTION

1. Field of the Invention

The present invention relates to an optical transmitter, and more particularly to an EML (Electro-absorption Modulator Laser) optical transmitter.

2. Description of the Related Art

As the transmission speed increases in an optical system, optical signals are influenced by a chirp. As a result, if a semiconductor laser used for loading optical signals is driven in a direct-modulation type transmitter, the transmission characteristics of optical signals tend to deteriorate. As such, an optical modulation is typically performed using an external modulator. However, the usage of an external modulator increases the cost of optical transmitters. An EML is a module consist of a semiconductor laser and a modulator integrated on a substrate, and is widely being used as an optical transmitter due to its economical implementation.

In general, as far as an optical transmission is concerned, excellent transmission characteristics are obtained if transmitted optical signals have a negative chirp and a large extinction ratio at the same time. However, in the case of implementing the EML, the extinction ratio and the chirp characteristics are varied greatly according to the range of a bias and the applied voltage. If the extinction ratio is increased, a positive chirp is increased. Then, the transmission characteristics deteriorate drastically according to the transmission distance. "Extinction ratio" represents a ratio ($I_{max}/I_{min}$) between the maximum intensity ($I_{max}$) and the minimum intensity ($I_{min}$) of transmitted light as the intensity of transmitted light is varied in an optical modulator. Hence, the extinction ratio is a measure of the characteristics of an optical modulator. Therefore, when using an EML for transmission, it is customary to decrease the positive chirp in spite of the decrease in the extinction ratio.

FIG. 1 shows the configuration of a transmission link employing a conventional EML optical transmitter. As shown, the transmission link comprises an electric signal generator 11 for generating electric signals; an EML 12 for generating light signals for transmission; optical fibers 13 for transferring optical signals from the EML 12; and, an optical receiver 14 for receiving the optical signals from the optical fibers 13.

FIG. 2 illustrates the characteristic curves of optical outputs and chirps graphically according to the applied voltages of a typical EML. In the drawing, the X-axis represents the applied voltages, the Y-axis on the right-hand side represents the intensity of chirp signals, and the Y-axis on the left-hand side represents a relative transmission, which indicates the intensity of modulated optical signals per the intensity of applied electric signals.

As shown in FIG. 2, the EML has a negative chirp when the applied voltage is over 0.7 V, and a positive chirp when the applied voltage is below 0.7 V. In order to obtain a large extinction ratio, the width of the applied voltage must be increased. This increases the swing width up to 0–0.7 V regions, which include the majority of positive chirps. Note that the regions of the increased positive chirp affects the transmission performances.

In general, although a large positive chirp is no problem before a transmission, as the transmission distance increases, the transmission characteristics deteriorate drastically. Therefore, for the purpose of improving the transmission performances, the positive chirp must be reduced. This means that the swing width of the applied voltage must be reduced and, to that end, the extinction ratio must be reduced.

Therefore, there is a need to improve the transmission characteristics of transmitters by reducing the positive chirp and the extinction ratio simultaneously.

SUMMARY OF THE INVENTION

Accordingly, the present invention has been made to solve the above-mentioned problems occurring in the prior art and provides additional advantages, by providing am EML transmitter with a band stop filter that can provide improved transmission characteristics before and after the transmission, by improving the chirp characteristics and the extinction ratio when transmitting optical signals using an EML.

In one embodiment, an EML transmitter applying a band stop filter is provided and includes: an EML for generating transmission light and loading electric signals to be transmitted, after being subject to an optical modulation; a first lens for focusing optical signals from the EML to prevent the optical signal loss; a second lens for focusing the optical signals into a core portion of an optical line through which the transmission is to be performed; a band stop filter for removing the D.C. component from the optical signals; and, a backflow preventor for interrupting the reflected optical signals flowing back into the EML.

BRIEF DESCRIPTION OF THE DRAWINGS

The above features and advantages of the present invention will be more apparent from the following detailed description taken in conjunction with the accompanying drawings, in which.

DETAILED DESCRIPTION OF THE PREFERRED EMBODIMENT

Hereinafter, an EML transmitter applying a band stop filter according to the preferred embodiments of the present invention will be described with reference to the accompanying drawings. For the purposes of clarity and simplicity, a detailed description of known functions and configurations incorporated herein will be omitted as it may make the subject matter of the present invention unclear.

Figure 1:
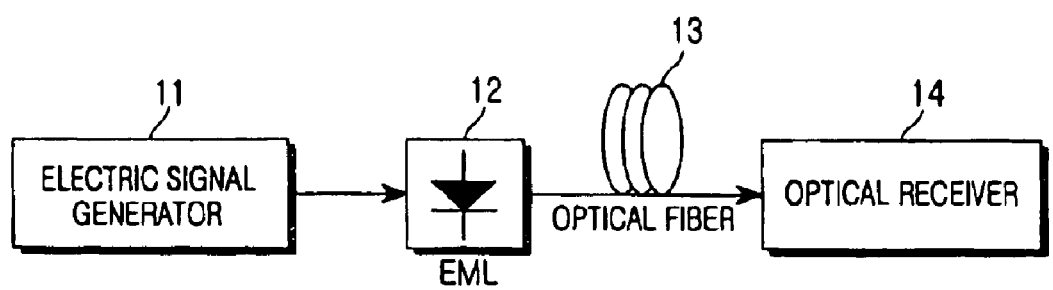
FIG. 1 shows a configuration of a transmission link employing a conventional EML optical transmitter.
Figure 2:
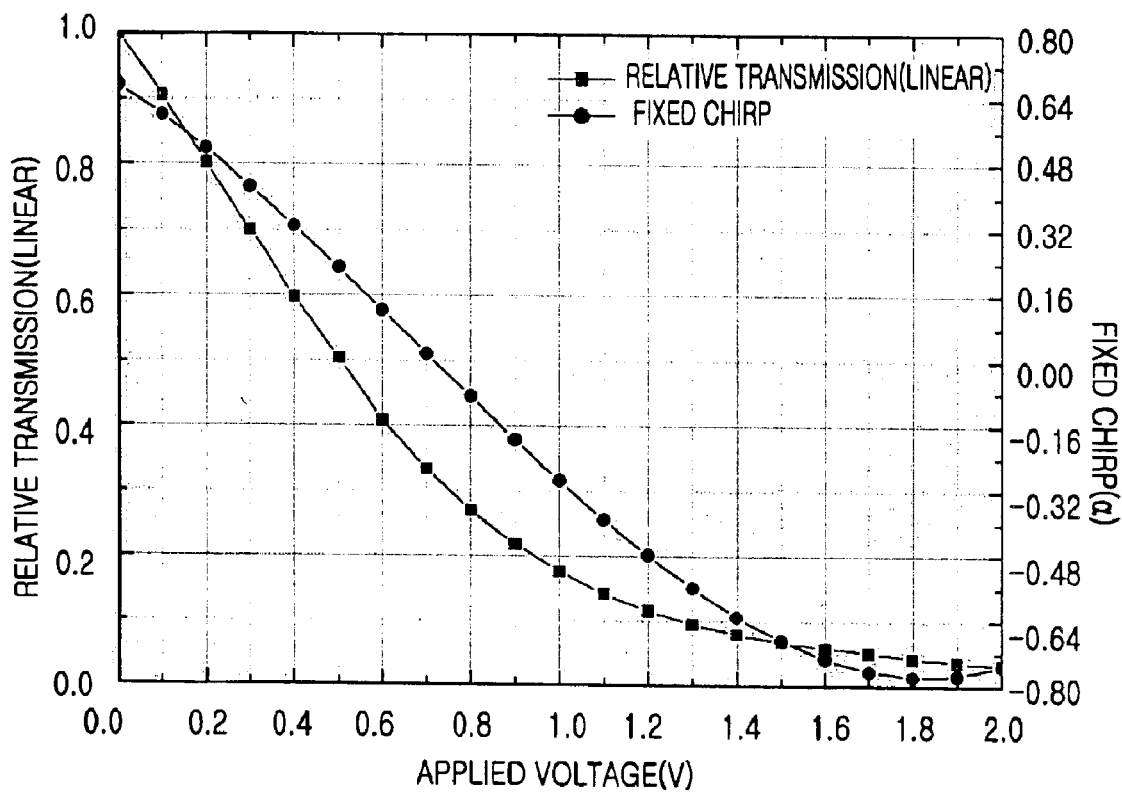
FIG. 2 illustrates the characteristic curves of optical outputs and chirps according to applied voltages of a typical EML.
Figure 3:
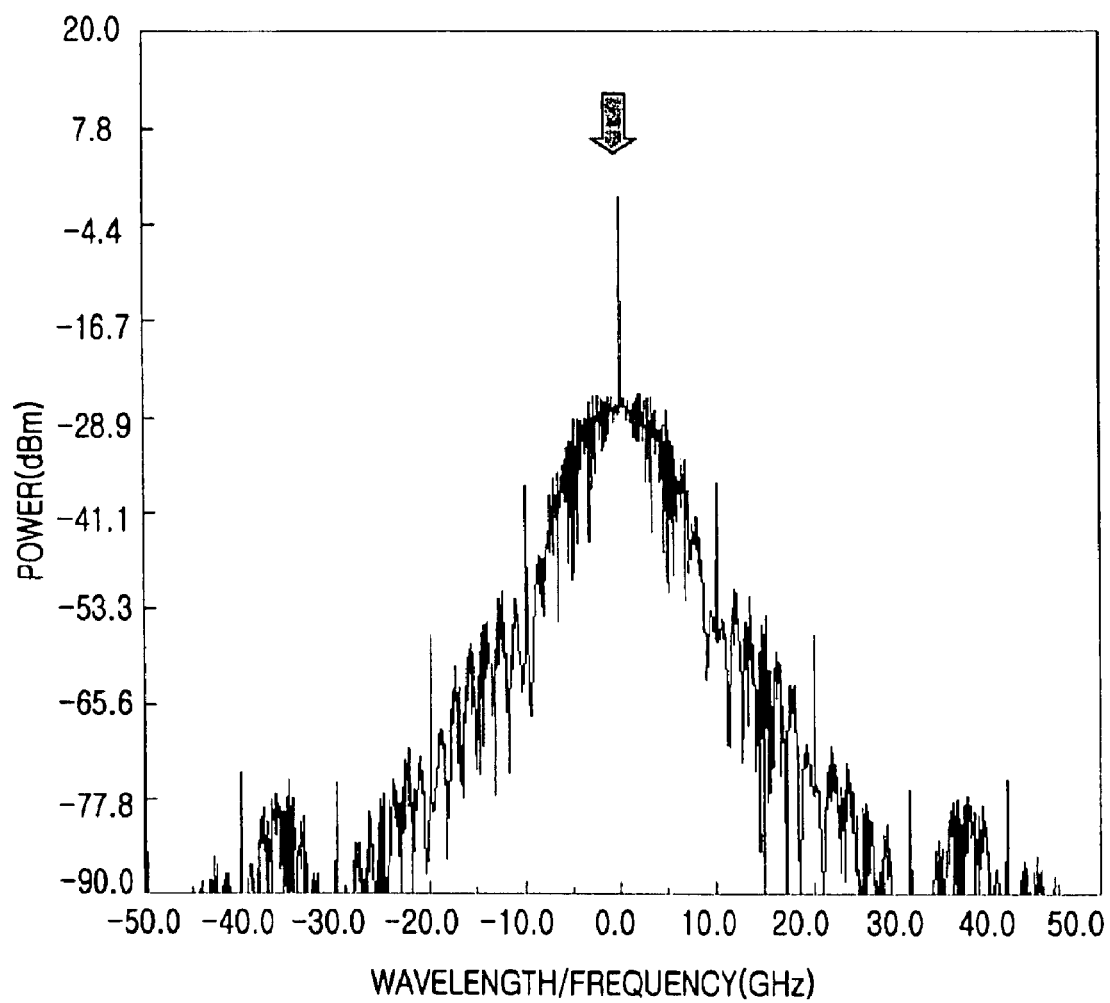
FIG. 3 illustrates the optical spectrum of a typical EML transmitter.

In order to help the understanding of the present invention, FIG. 3 illustrates the optical spectrum of a typical EML transmitter.

As shown in FIG. 3, in the optical spectrum of frequency vs. power of a typical EML transmitter, the power has its peak value at the carrier frequency (as indicated by an arrow in FIG. 3), which includes a large D.C. component of the signals. Accordingly, by removing the D.C. component with a band stop filter having a narrow band, not only the '1' level but also the '0' level of the signals are reduced, thereby increasing the extinction ratio.

Figure 4:
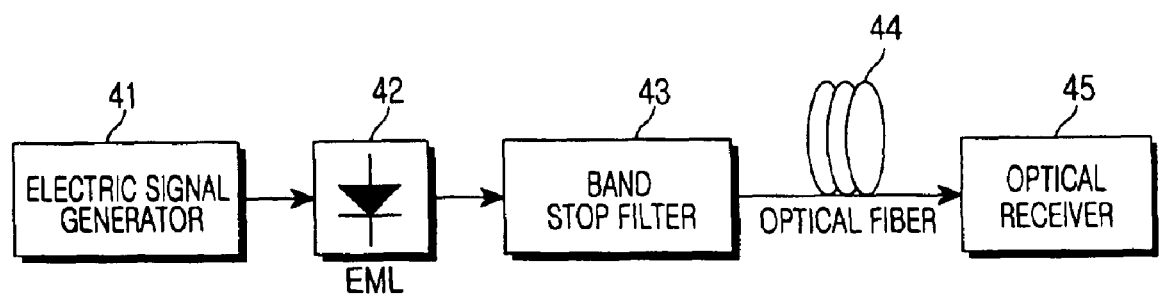
FIG. 4. shows a configuration of a transmission link employing an EML optical transmitter according to an embodiment of the present invention.

FIG. 4 shows a configuration of a transmission link employing an EML optical transmitter according to the teachings of the present invention. As shown, the transmission link using an EML transmitter includes: an electric signal generator 41 for generating electric signals to be transmitted; an EML 42 for generating transmission light in response to the electric signals generated by the electric signal generator 41, after being subject to an optical modulation; a band stop filter 43 for removing the D.C. component of the output from the EML 42 in order to increase the extinction ratio; optical fibers 44 for transferring optical signal output from the band stop filter 43; and, an optical receiver 45 for receiving the optical signals transmitted through the optical fibers 44. Note that the present invention covers the transmission components of the EML 42 and the band stop filter 43, as explained hereinafter.

Figure 5:
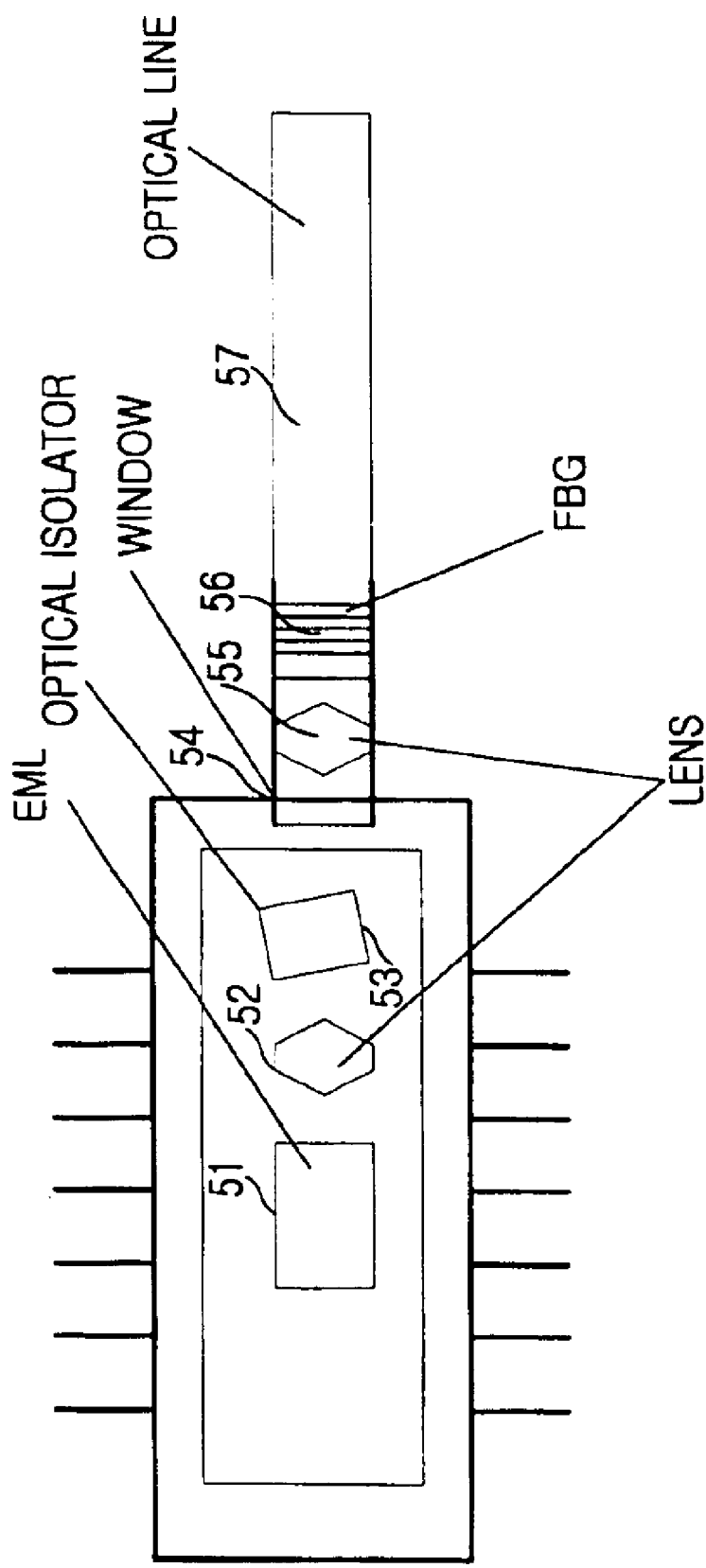
FIG. 5 shows a configuration of a first embodiment of a EML transmitter according to the present invention.

FIG. 5 shows a configuration of a first embodiment of a EML transmitter according to the present invention.

As shown, the EML transmitter according to the present invention includes: an EML 51 for generating optical signals in response to the input electrical signals, after being subject to an optical modulation, for transmission; a first lens 52 for focusing the optical signal output from the EML 51 into a fiber which in turn prevents optical signal loss; a second lens 55 for focusing the optical signals into a core portion of an optical line 57; a FBG (Fiber Bragg Grating) 56 acting as a band stop filter for removing the D.C. component from the received optical signals; and an optical isolator 53 for interrupting optical signals flowing back into the EML 51 due to the reflection of signals caused by the FBG 56. The optical signals generated by the EML 51 pass through the first lens 52 and the optical isolator 53. Then, the housing of the EML device outputs the optical signals through its window 54. The outputted optical signals pass through the second lens 55 and thus are focused into the core portion of the optical line 57. The FBG 56 removes the D.C. component from the optical signals and input the optical signals to the optical line 57. Optical signals flowing back into the EML 51 from the FBG 56 are prevented by the optical isolator 53.

Figure 6:
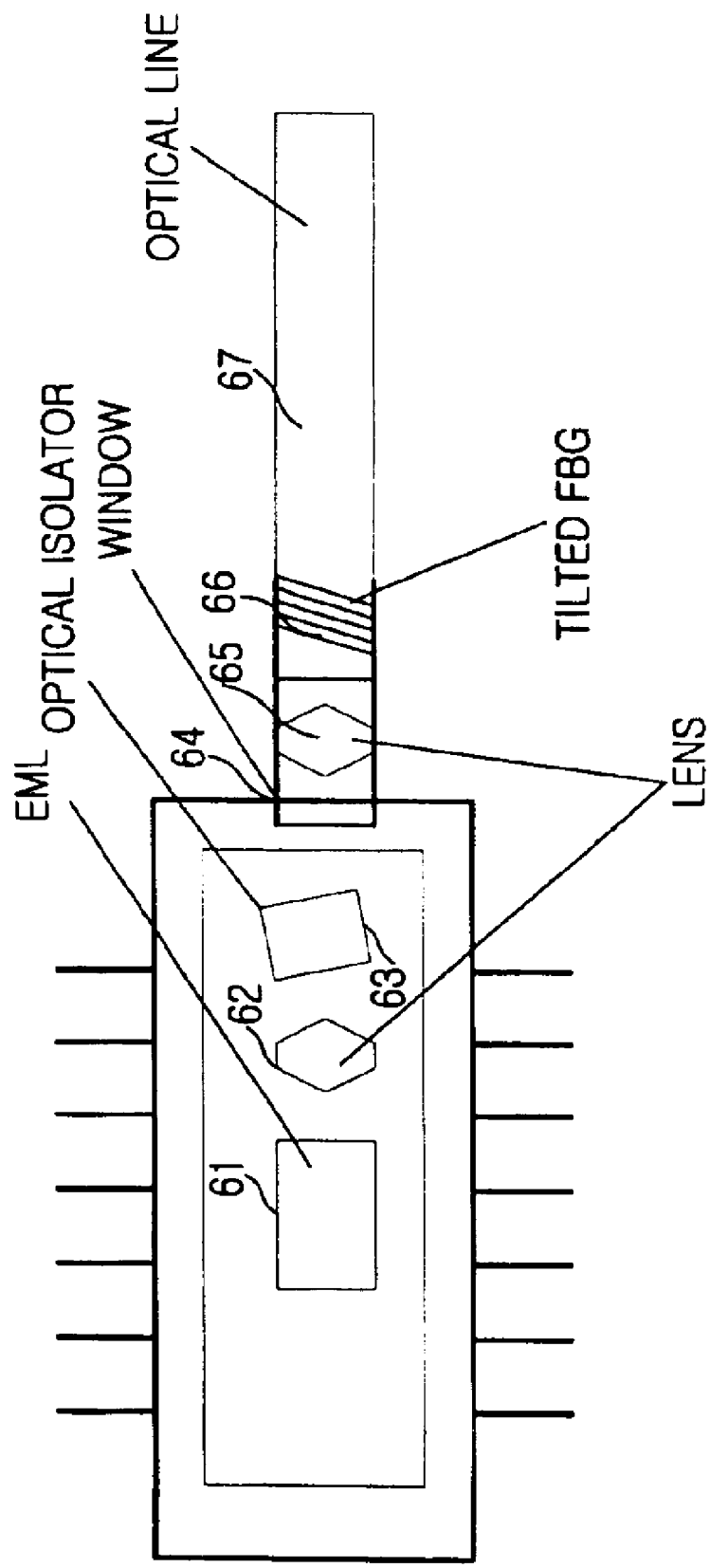
FIG. 6 shows a configuration of a second embodiment of a EML transmitter according to the present invention.

FIG. 6 shows a configuration of a second embodiment of a EML transmitter according to the present invention.

As shown, the EML transmitter according to a second embodiment of the present invention includes: an EML 61 for generating optical signals in response to the input electrical signals, after being subject to an optical modulation, for transmission; a first lens 62 for focusing the optical signal output from the EML 61 in order to prevent loss of the optical signals; a second lens 65 for focusing the received optical signals into a core portion of an optical line 67; a TFBG (Tilted Fiber Bragg Grating) 66 acting as a band stop filter for removing the D.C. component from the optical signals received therein; and, an optical isolator 63 for preventing optical signals flowing back into the EML 61 due to the reflection of signals caused by the TFBG 66.

In operation, the optical signals generated by the EML 61 pass through the first lens 62 and the optical isolator 63. Then, the housing of the EML device outputs the optical signals through its window 64. The outputted optical signals pass through the second lens 65 and are focused into the core portion of the optical line 67. The TFBG 66 removes the D.C. component from the optical signals and inputs the optical signals to the optical line 67. Here, the TFBG 66 is used because, unlike an ordinary FBG, it can play a role in reducing the backflow of the optical fibers. Further, the optical isolator 63 also prevents the backflow of the optical signals.

Figure 7:
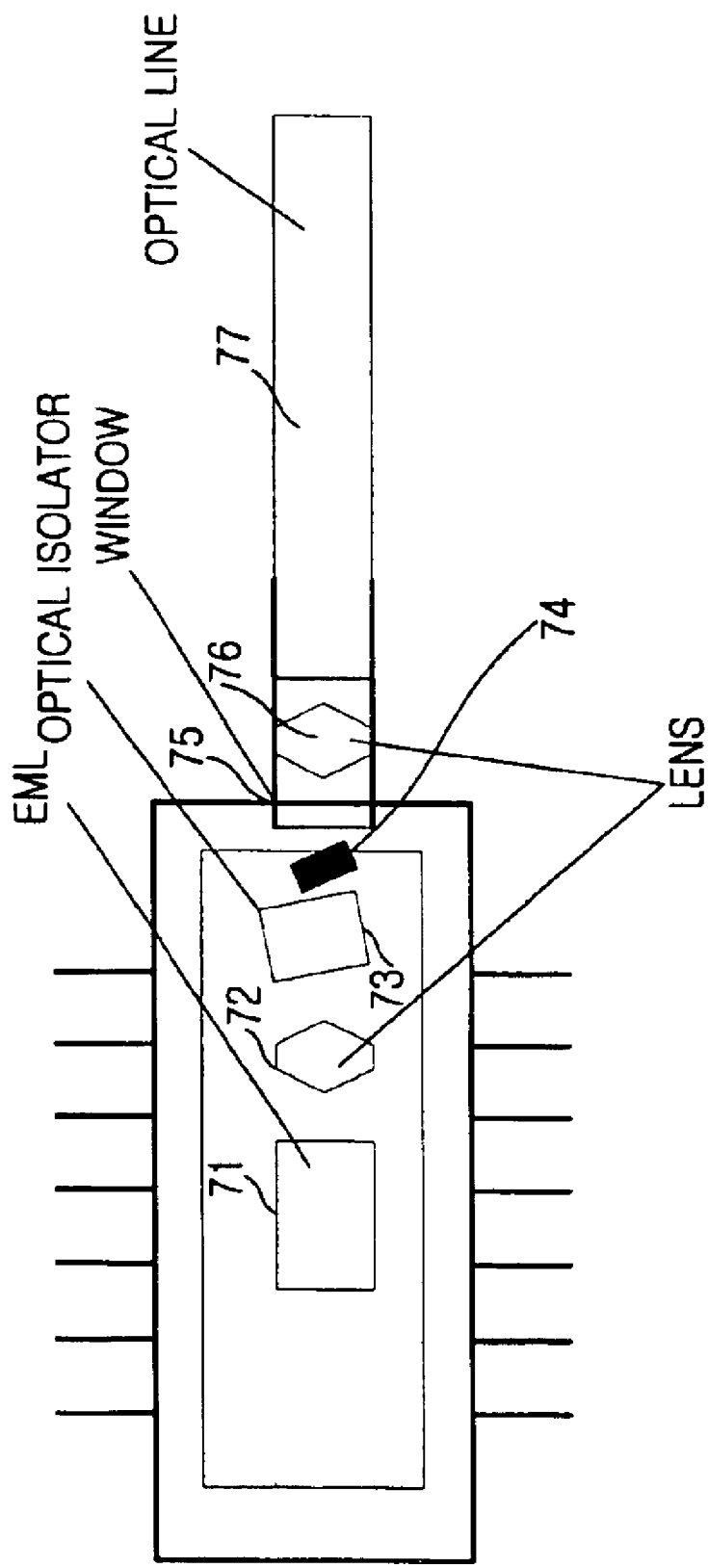
FIG. 7 shows a configuration of a third embodiment of a EML transmitter according to the present invention.

FIG. 7 shows a configuration of a third embodiment of a EML transmitter according to the present invention.

As shown, the EML transmitter according to a third embodiment of the present invention includes: an EML 71 for generating optical signals in response to the input electrical signals, after being subject to an optical modulation, for transmission; a first lens 72 for focusing optical signal output from the EML 71 to prevent loss of the optical signals; a second lens 76 for focusing the optical signals into a core portion of an optical line 77; a chip filter 74 acting as a band stop filter for removing the D.C. component from the optical signals to be transmitted; and an optical isolator 73 for preventing optical signals flowing back into the EML 71 due to the reflection of signal caused by the chip filter 74 due to reflection. The optical signals generated by the EML 71 pass through the first lens 72 and the optical isolator 73. Then, the housing of the EML device outputs the optical signals through its window 75. The outputted optical signals pass through the second lens 76 and are focused into the core portion of the optical line 77. The chip filter 74 removes the D.C. component from the optical signals and inputs the optical signals to the optical line 77.

Figure 8:
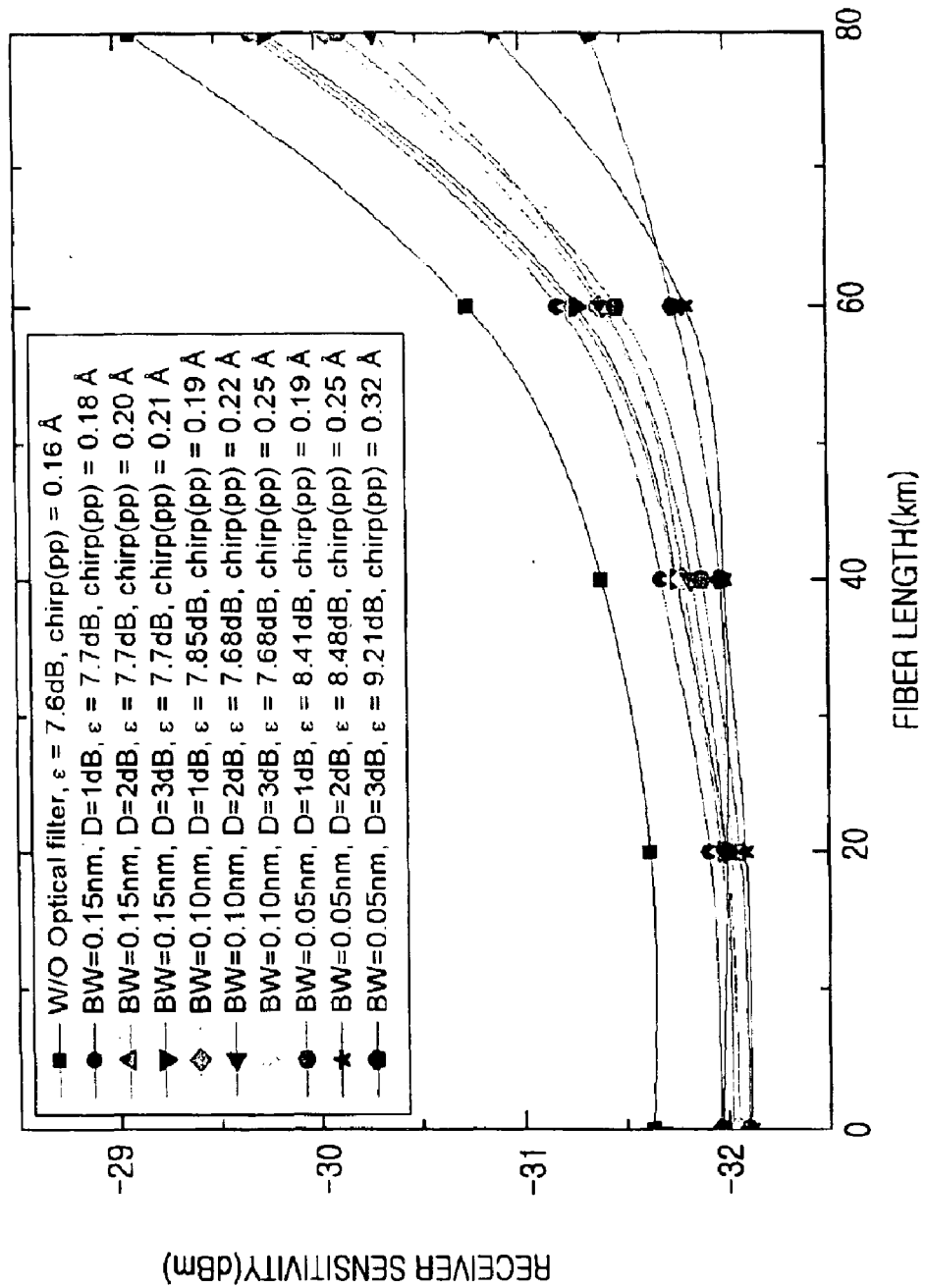
FIG. 8 illustrates the comparison of transmission characteristics between an EML transmitter according to the prior art and an EML transmitter according to the present invention; and, FIG. 9 illustrates the band width and the depth of the band stop filter used in the present invention.

FIG. 8 illustrates graphically a comparison of the transmission characteristics between an EML transmitter according to the prior art and an EML transmitter according to the present invention.

The results of a simulation of a receiver sensitivity in 10–12 BER (Bit Error Rate) according to the band width (BW) and the depth of a band stop filter when a 10 Gb/s NRZ signal is transmitted through standard single-mode optical fibers are shown in FIG. 8. The X-axis represents the fiber length of the optical line and the Y-axis represents the receiver sensitivity.

As shown, the EML transmitter according to the prior art has an extinction ratio of 7.6 dB and a chirp (peak to peak, hereinafter, referred to as "pp") of 0.16 Å. In contrast, according to the present invention, when the band stop filter has a band width of 0.15 nm and a depth of 1 dB, the extinction ratio is 7.7 dB and the chirp (pp) is 0.18 Å. When the band width is 0.15 nm and the depth is 2 dB, the extinction ratio is 7.7 dB and the chirp (pp) is 0.20 Å. When the band width is 0.15 nm and the depth is 3 dB, the extinction ratio is 7.7 dB and the chirp (pp) is 0.21 Å.

Moreover, when the band width is 0.10 nm and the depth is 1 dB, the extinction ratio is 7.85 dB and the chirp (pp) is 0.19 Å, and when the band width is 0.05 nm and the depth is 1 dB, the extinction ratio is 8.41 dB and the chirp (pp) is 0.19 Å. These results indicate that the use of band stop filter improves the transmission characteristics.

According to the simulation results of FIG. 8, the narrower band and the deeper depth of the band stop filter ensure the larger extinction ratio and the larger negative chirp component, thus improving the transmission performances. Compared with a case using no band stop filter, the transmission performances are improved by 0.5 dB or more before the transmission and by up to 2 dB after the transmission of 80 km.

Figure 9:
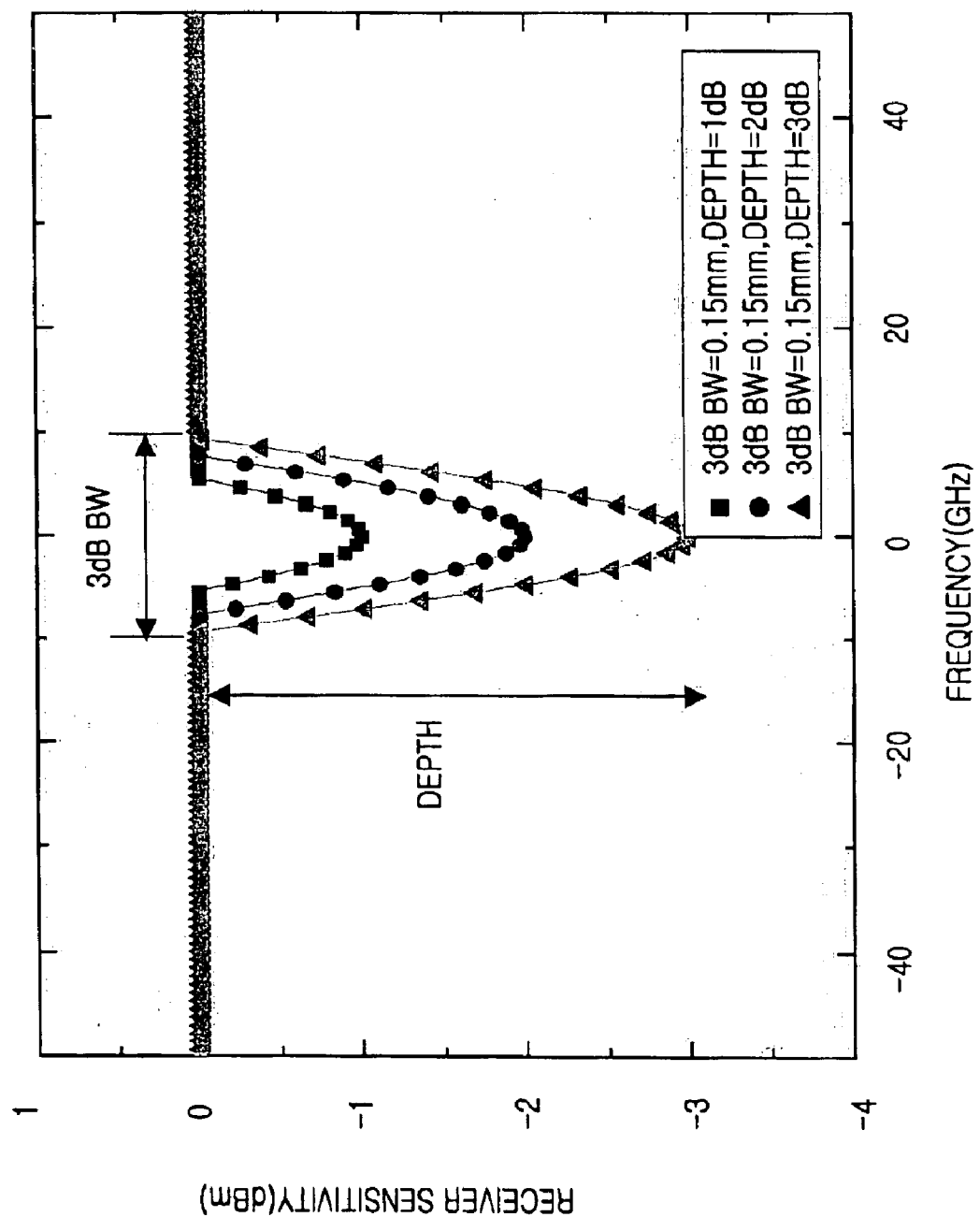

FIG. 9 illustrates the band width (BW) and the depth of the band stop filter used in the present invention.

In the drawing, there are illustrated the values of the band width and the depth of transmittance of the band stop filter, when the 3 dB band width is 0.15 nm and the depth of transmittance is 1 dB, 2 dB and 3 dB, respectively.

As mentioned above, by providing an EML transmitter using a suitable band stop filter, the present invention improves the extinction ratio and the chirp characteristics, and thereby improves the transmission sensitivity before and after a transmission.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An optical transmitter comprising:
   a modulator for generating optical signals in response to input electrical signals;
   a first lens for focusing output of the modulator to prevent signal loss;
   a second lens for focusing the output of the first lens into a core portion of an optical line; and,
   an optical band stop filter for removing the D.C. component from the output of the second lens whereby an extinction ratio of the optical transmitter is increased.

2. The transmitter according to claim 1, further comprising an optical isolator coupled between the first lens and the second lens for preventing the reflected optical signals flowing back into the modulator.

3. The transmitter according to claim 1, wherein the band stop filter comprises a Fiber Bragg Grating.

4. The transmitter according to claim 1, wherein the band stop filter comprises a Tilted Fiber Bragg Grating.

5. The transmitter according to claim 1, wherein the band stop filter comprises an integrated filtering element.

6. The transmitter according to claim 1, wherein the band stop filter is provided outside of the transmitter.

7. The transmitter according to claim 1, wherein the modulator is an Electro-absorption Modulator Laser.

8. An optical transmitter comprising:
   a generator for providing electrical signals;
   a modulator for providing optical signals in response to the electrical signals;
   a filter for removing the DC component of the optical signals; and,
   the filter comprising:
   a first lens for focusing the optical signals;
   a second lens for focusing the output of the first lens into a core portion of an optical line; and,
   an optical band stop filter for removing the D.C. component from the output of the second lens whereby an extinction ratio of the optical transmitter is increased.

9. The transmitter according to claim 8, further comprising an optical isolator coupled between the first lens and the second lens for preventing the reflected signals flowing back into the modulator.

10. The transmitter according to claim 8, wherein the band stop filter comprises a Fiber Bragg Grating.

11. The transmitter according to claim 8, wherein the band stop filter comprises a Tilted Fiber Bragg Grating.

12. The transmitter according to claim 8, wherein the band stop filter comprises an integrated filtering element.

13. The transmitter according to claim 8, wherein the band stop filter is located outside of the modulator.

14. The transmitter according to claim 8, wherein the modulator is an Electro-absorption Modulator Laser.

15. An optical transmitter comprising:
   a modulator for generating optical signals in response to input electrical signals;
   a first lens for focusing output of the modulator to prevent signal loss;
   a filter for removing the D.C. component from the output of the first lens whereby an extinction ratio of the optical transmitter is increased; and,
   a second lens for focusing the output of the filter into a core portion of an optical line.

16. The transmitter according to claim 15, further comprising an optical isolator coupled between the first lens and the filter for preventing the reflected optical signals flowing back into the modulator.

17. The transmitter according to claim 15, wherein the modulator is an Electro-absorption Modulator Laser.

* * * * *